United States Patent [19]

Mihashi et al.

[11] Patent Number: 4,733,399
[45] Date of Patent: Mar. 22, 1988

[54] SEMICONDUCTOR LASER DEVICE HAVING INTEGRAL OPTICAL OUTPUT MODULATOR

[75] Inventors: Yutaka Mihashi; Yutaka Nagai, both of Itami, Japan

[73] Assignee: Mitsubishi Denki Kabushiki Kaisha, Tokyo, Japan

[21] Appl. No.: 856,937

[22] Filed: Apr. 25, 1986

[30] Foreign Application Priority Data

Apr. 30, 1985 [JP] Japan .................................. 60-94805

[51] Int. Cl.$^4$ .................................................. H01S 3/19
[52] U.S. Cl. ........................................ 372/50; 357/17; 357/41; 372/46
[58] Field of Search ................ 372/50, 45, 46, 48, 372/26; 357/17, 41

[56] References Cited

U.S. PATENT DOCUMENTS

| | | | |
|---|---|---|---|
| 4,361,887 | 11/1982 | Nakamura et al. | 372/50 |
| 4,408,330 | 10/1983 | An et al. | 372/45 |
| 4,521,888 | 6/1985 | Hayashi et al. | 372/50 |
| 4,608,696 | 8/1986 | Law et al. | 372/50 |

FOREIGN PATENT DOCUMENTS 0047035 8/1981 European Pat. Off. .
0156014 12/1984 European Pat. Off. .

OTHER PUBLICATIONS

C. Cohen, *Optoelectronic Chip Integrates Lasers and Pair of FETs*, Electronics, No. 13, (Jun. 30, 1983): 89–90.
U. Koren et al., *Recent Developments in Monolithic Integration of InGaAsP/InP Optoelectronic Devices*, IEEE Journal of Quantum Electronics, vol. QE–18, No. 10, (Oct. 1982): 1653–1661.
D. Botez, *Single–Node Lasers for Optical Communications*, IEEE Proc., vol. 129, Pt. I, No. 6, (Dec. 1982): 237–251.
A. Tamer, K, Rauch and J. Moll, *Numerical Comparison of DMOS, VMOS and UMOS Power Transistors*, IEEE Transactions on Electron Devices, vol. ED–30, No. 1, (Jan. 1983): 73–76.
H. Grothe and W. Proebster, *Monolithic Integration of InGaAsP/InP Led and Transistor–A Light–Coupled Bistable Electro–Optical Device*, Electronics Letters, vol. 19, No. 6, (Mar. 17, 1983): 194–196.
"Monolithic Integration of a GaAlAs Injection Laser with a Schottky–Gate Field Effect Transistor", T. Fukuzawa et al., Applied Phys. Letters, 36(3), 1 Feb. 1980, pp. 181–183.

*Primary Examiner*—James W. Davie
*Attorney, Agent, or Firm*—Lowe, Price, Leblanc, Becker & Shur

[57] ABSTRACT

A semiconductor laser device comprises a semiconductor laser portion (17) including a double hetero structure and a vertical MIS-FET portion (18) form on, and in series with, the semiconductor laser portion (17). The vertical MIS-FET portion (18) includes an n-type GaAs layer (6), a p-type GaAs layer (7), an n-type GaAs layer (8), and a striped groove (31) having V-shaped cross-section formed from the top surface of the n-type GaAs layer (8) to the n-type GaAs layer (6). A metal gate electrode (11) is further provided on the top surface of the striped groove (31), on an insulating film (10). A current (41) flowing through the vertical MIS-FET portion (18) is changed according to a photo modulating signal applied to the metal gate electrode (11) and, a current (40) is also changed according to the current (41). Accordingly, a laser oscillation output of the semiconductor laser portion (17) is also changed to accomplish the optical output modulation of the semiconductor laser.

13 Claims, 5 Drawing Figures

FIG. 3
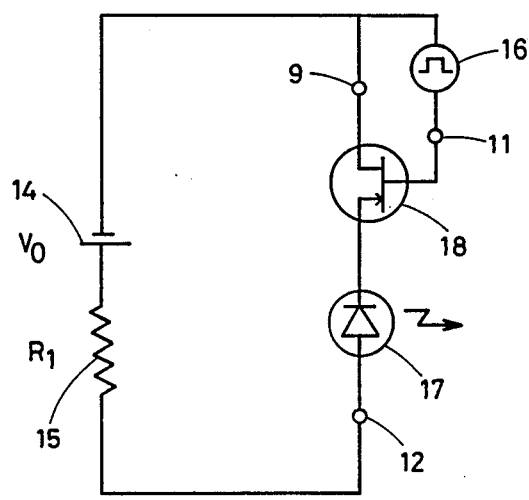
FIG. 4A
FIG. 4B
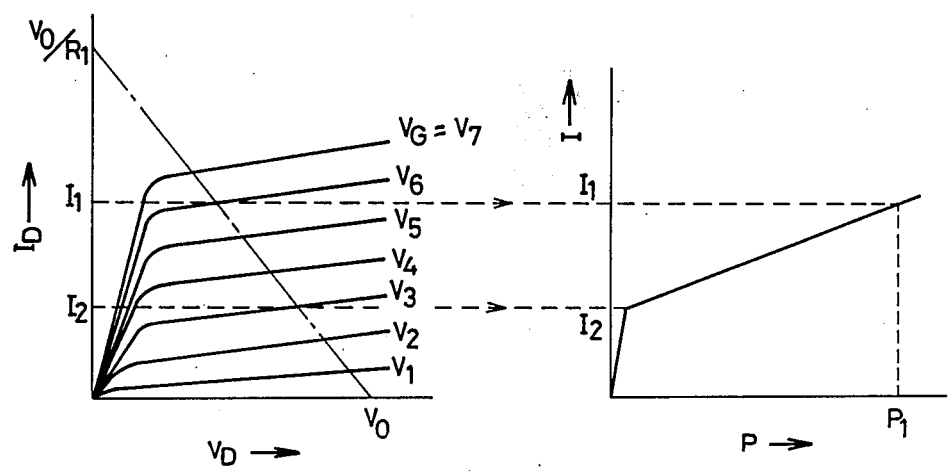

SEMICONDUCTOR LASER DEVICE HAVING INTEGRAL OPTICAL OUTPUT MODULATOR

BACKGROUND OF THE INVENTION

1. Field of the Invention

The present invention relates to a semiconductor laser device, and more specifically, it relates to a semiconductor laser device having a structure of a composite device having a semiconductor laser and an electric device for modulating the optical output thereof made integral with each other.

2. Description of the Prior Art

Recently, a semiconductor laser has come into practical use such as a device for reading signals of optical disks, for optical communication, or for a light source for writing into an optical disk. In the case where a semiconductor laser is used for optical communication or for writing into an optical disk, the optical output of the semiconductor laser needs to be modulated by some means or other. So far, the optical output of a semiconductor laser has been modulated by changing or turning on and off the current flowing through the semiconductor laser according to a prescribed signal by means of a driving/modulating circuit comprised of a transistor, IC, or the like, provided separately from the semiconductor laser.

As an example of such conventional semiconductor laser devices, a device having a semiconductor laser and a field effect transistor for modulation integrated in a horizontal direction on a substrate is disclosed in T. Fukuzawa, et al., Applied physics Letters 36 (3), 1 February 1980, p. 181, "Monolithic Integration of a GaAlAs Injection Laser with a Shottky-Gate Field Effect Transistor".

However, the conventional method for modulating optical outputs of a semiconductor laser by means of a driving/modulating circuit provided separately from the semiconductor laser has drawbacks such as high cost due to the complicated circuit structure, or low system reliability due to the increase of the number of parts. Recently, since most of the signal processing ICs or LSIs are formed with MOS transistors, these ICs and LSIs generally can drive small currents only. Consequently, in the case of a semiconductor laser which requires some 10 mA of a driving current, a bipolar IC or a transistor having a large driving current need be additionally provided causing another problem that the cost of the driving/modulating circuit increases.

SUMMARY OF THE INVENTION

Briefly stated, the present invention comprises a semiconductor laser divice comprising a semiconductor laser portion and at least one vertical field effect transistor portion formed on the semiconductor laser portion for modulating the optical output of the semiconductor laser portion. Such semiconductor laser portion includes a semiconductor substrate of a first conductivity type and at least one semiconductor laser having a double hetero structure formed on the top surface of such semiconductor substrate. The vertical field effect transistor portion comprises a first semiconductor layer of a second conductivity type formed on the top surface of the semiconductor laser portion, a second semiconductor layer of the first conductivity type formed on the top surface of the first semiconductor layer, a third semiconductor layer of the second conductivity type formed on the top surface of the second semiconductor layer; a striped groove, which is deep enough to reach at least the first semiconductor layer from the top surface of the third semiconductor layer, is formed in said first, second and third semiconductor layer; said vertical field effect transistor portion further comprises an insulating film formed on the surface of the striped groove and a gate electrode formed on the surface of said insulating film.

A primary object of the present invention is to provide a semiconductor laser device with low cost and high reliability.

Another object of the present invention is to provide a semiconductor laser device which is capable of driving/mcdulating the optical output of the semiconductor laser with a small current.

It is a primary advantage of the present invention that the semiconductor laser portion and the vertical field effect transistor portion are formed being connected in series and integrated with each other in the vertical direction.

It is another advantage of the present invention that the optical output of the semiconductor laser portion can be modulated merely by applying a modulating signal voltage to the gate electrode of the vertical field effect transistor without providing any complicated driving/modulating circuit externally It is a further advantage of the present invention that since a field effect transistor is used for the modulation of the optical output, only a voltage signal is applied as the optical output modulating signal, so that hardly any current is consumed.

These and other objects, features and advantages of this invention will be apparent from the following description of the preferred embodiments taken with the accompanying drawings.

BRIEF DESCRIPTION OF THE DRAWINGS

FIG. 3 is a schematic diagram of an equivalent circuit for the semiconductor laser device and the external circuit shown in FIG. 2.

FIGS. 4A and 4B are graphs for describing the modulating operation according to one embodiment of this invention.

DESCRIPTION OF THE PREFERRED EMBODIMENTS

Figure 1:
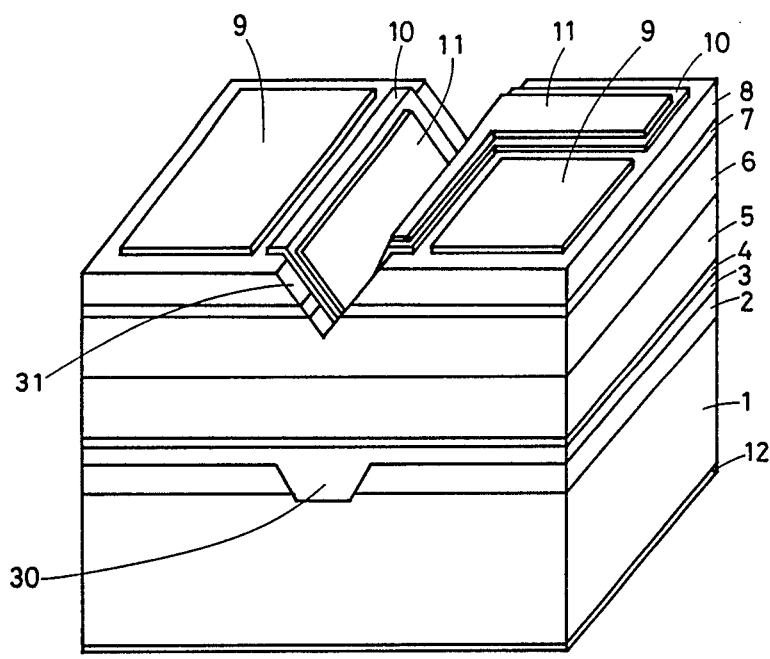
FIG. 1 is a perspective view of a semiconductor laser device according to one embodiment of this invention.

FIG. 1 is a perspective view of a semiconductor laser device according to one embodiment of this invention. To start with, the structure of the semiconductor laser device shown in FIG. 1 will be described. Referring to FIG. 1, an n-type GaAs current block layer 2, a p-type $Al_xGa_{1-x}As$ clad layer 3, a p-type or n-type $Al_yGa_{1-y}As$ activated layer 4, and an n-type $Al_xGa_{1-x}As$ clad layer 5 are formed on the top surface of a p-type GaAs substrate 1 in this order. A portion of the p-type $Al_xGa_{1-x}As$ clad layer 3 forms a striped structure 30 having a trapezoidal cross-section which reaches the p-type GaAs substrate 1 through the n-type GaAs current block layer 2. A p-side ohmic electrode 12 composed of Ti-Au or the like is formed on the lower surface of the p-type GaAs substrate 1. The p-type ohmic electrode 12, p-type GaAs substrate 1, n-type GaAs current block layer 2, p-type $Al_xGa_{1-x}As$ clad layer 3, $Al_yGa_{1-y}As$ activated layer 4 and n-type $Al_xGa_{1-x}As$ clad layer 5 form a CSP (Channeled Substrate Planar Stripe) semiconductor laser portion of an internal current squeezing structure. The trapezoidal stripe 30 is to squeeze the current of the semiconductor laser which is formed as described above. Such laser structure can be implemented readily by a common liquid phase epitaxy. When the laser oscillation wavelength is 780 nm, the proportion of composition of Al (x, y) of the p-type $Al_xGa_{1-x}As$ clad layer 3, n-type $Al_xGa_{1-x}As$ clad layer 5 and $Al_yGa_{1-y}As$ activated layer 4 may be $x=0.15$, $y=0.45$. A vertical MIS-FET (metal insulator semiconductor field effect transistor) portion is formed on the top surface of this laser structure. Namely, an n-type GaAs layer 6, which is a source region, is formed on the top surface of the n-type $Al_xGa_{1-x}As$ clad layer 5, a p-type GaAs layer 7 is formed on the top surface thereof, and an n-type GaAs layer 8 is formed on the top surface thereof. The p-type GaAs layer 7 is exposed by etching, as will be described later, and the p-type GaAs layer 7 functions as a channel region at the adjacent portions of the exposed surface. The n-type GaAs layer 8 functions as a drain region. These layers, i.e., the n-type GaAs layer 6, p-type GaAs layer 7 and n-type GaAs layer 8 also can be readily formed above the semiconductor laser portion simultaneously in a succeeding form by the common liquid phase epitaxy or the metalorganic chemical vapor deposition. The thickness of the n-type GaAs layer 6 and n-type GaAs layer 8 may be selected to be about 1 $\mu$m to several $\mu$m, carrier density thereof may be about $1\times 10^{18}$ cm$^{-3}$. The thickness of the p-type GaAs layer 7 may be about 1 $\mu$m to several $\mu$m, and the carrier density thereof may be $1\times 10^{17}$ cm$^{-3}$. A striped groove 31 having a V shaped cross-section is formed in the upper portion of the npn structure, the width of the opening thereof being about 2 $\mu$m ~ 5 $\mu$m, and the depth being such that the bottom of the groove reaches at least the n-type GaAs layer 6. The groove 31 is placed almost directly above the trapezoidal striped structure 30 for squeezing the internal current of the semiconductor laser portion. The V shaped striped groove 31 is formed after the patterning of a prescribed resist mask on the top surface of the n-type GaAs layer 8 by etching the n-type GaAs layer 8, p-type GaAs layer 7 and n-type GaAs layer 6 using a GaAs etchant such as an etchant composed of aqueous ammonia (NH$_4$OH) and hydrogen peroxide (H$_2$O$_2$), the proportion of which is 30:1. A portion of the p-type GaAs layer 7 is exposed by this etching, and the portion adjacent to the exposed surface functions as a channel region of the MIS-FET portion as described above. An insulating film 10 of several 1000 Å thickness formed of alumina (Al$_2$O$_3$) film or silicon oxide (SiO$_2$) film or a multi layer film thereof is deposited on the top surfaces of the V shaped striped groove 31 and the n-type GaAs layer 8 by the CVD method or the like. A gate electrode 11 of Al etc., is formed on the top surface of the insulating film 10. An n-side ohmic electrode 9 of AuGe-Ni-Au etc., is formed on the top surface of the n-type GaAs layer 8. Thus, the n-type GaAs layer 6, p-type GaAs layer 7, n-type GaAs layer 8, the insulating film 10, the gate electrode 11 and the n-side ohmic electrode 9 form the vertical MIS-FET portion above the semiconductor laser portion.

Figure 2:
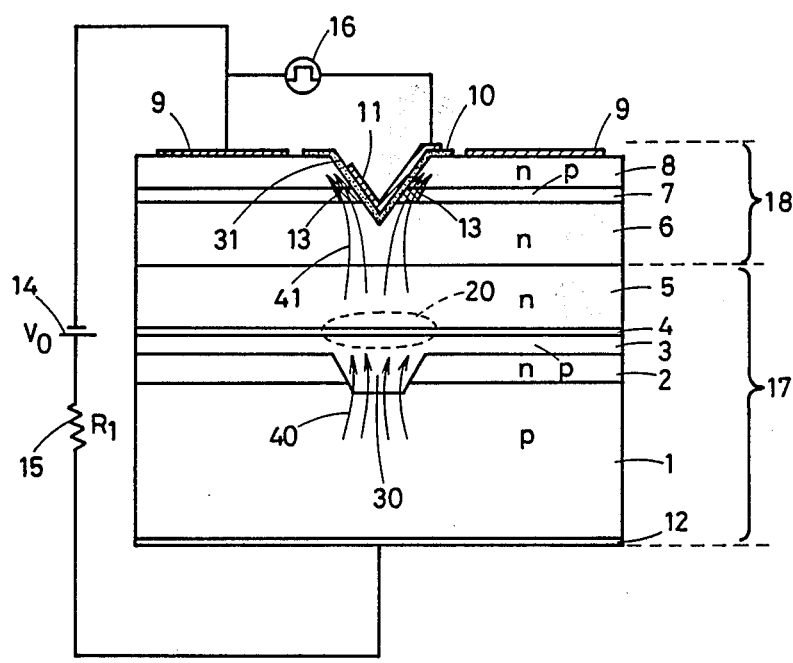
FIG. 2 shows a cross-section of a central portion of a semiconductor laser device shown in FIG. 1 and an external circuit connected to the semiconductor laser device.

FIG. 2 shows a cross-section of the central portion of the semiconductor laser device shown in FIG. 1 and an external circuit to be connected for actually driving-/modulating the semiconductor laser device. In FIG. 2, a DC power source 14 having the voltage of $V_0$ and a resistor 15 having the resistance value of $R_1$ for current limitation are connected in series between the p-side ohmic electrode 12 of the semiconductor laser portion 17 and the n-side ohmic electrode 9 of the MIS-FET portion 18. A positive voltage is applied to the p-side ohmic electrode 12, while a negative voltage is applied to the n-side onmic electrode 9. A modulating gate signal is applied to the gate electrode 11 from a signal source 16.

FIG. 3 is a schematic diagram of an equivalent circuit for the semiconductor laser device and the external circuit shown in FIG. 2. The operation of one embodiment of this invention will be hereinafter described with reference to FIGS. 1 and 3.

Now, let us consider a case where no mcdulating gate signal voltage is applied to the gate electrode 11. Since the MIS-FET portion 18 has a vertical directional pnp structure, the junction between the n-type GaAs layer 6 and the p-type GaAs layer 7 is in such a state that it is biased in the reverse direction. Therefore, if the applied voltage $V_0$ is set to be lower than the breakdown voltage of the junction, no current flows through the MIS-FET portion 18, so that no current flows through the semiconductor laser portion 17 which is connected in series to the MIS-FET portion 18. Accordingly, it is apparent that no laser oscillation occurs at the semiconductor laser portion 17 in this case.

A case where a positive gate voltage $V_G$ (a pulse or a dc voltage) is applied to the gate electrode 11 will be described. In this case, a negative charge (electron) is induced to the portions adjacent to the exposed surface of the p-type GaAs layer 7 in the V shaped striped groove 31, forming a current path 13 (FIG. 2) i.e., a inverted n-channel in the p-type GaAs layer 7. Electrons can flow through this n-channel 13. The flow of the current in this case is indicated by an arrow 41 in FIG. 2. At the same time, a current flows to the semiconductor laser portion 17 which is formed in series with the MIS-FET portion 18 through the opening of the trapezoidal striped structure 30 of the n-type GaAs current block layer 2, as shown by an arrow 40 in FIG. 2. On this occasion, if holes are injected concentratedly to the $Al_yGa_{1-y}As$ activated layer 4 from the p-type $Al_xGa_{1-x}As$ clad layer 3, and if electrons are injected concentratedly to the portions adjacent to the opening of the trapezoidal striped structure 30 of the n-type GaAs current block layer 2 from the n-type $Al_xGa_{1-x}As$ clad layer 5 and the flowing current is set to be higher than the oscillation threshold current Ith, then the laser oscillation occurs in the region 20 surrounded by a dotted line in FIG. 2.

FIG. 4A is a graph showing the operation characteristics of the vertical MIS-FET portion 18. FIG. 4A shows the drain current $I_D$-drain voltage $V_D$ characteristic plotted by a solid line taking the gate voltage $V_G$ as a parameter, and, also shows a load line plotted by an one-dotted chain line. Meanwhile, the voltage drop (forward directional voltage) of the semiconductor laser portion 17 is not taken into consideration in this case, for the purpose of simplification. FIG. 4B shows one example of the current I-optical output P characteristic of the semiconductor laser portion 17.

Now, when a gate voltage $V_6$ is applied to the gate electrode 11, a current $I_1$, which is determined by the point of intersection of the load line and the drain current $I_D$-drain voltage $V_D$ characteristic curve in FIG. 4A, flows to the MIS-FET portion 18. Therefore, when the current $I_1$ flows, a laser oscillation output $P_1$ corresponding to the current $I_1$ can be obtained at the semiconductor laser portion 17, as is apparent from FIG. 4B. When the gate voltage $V_G$ is made lower than the voltage $V_3$, the laser oscillation stops as is apparent from FIGS. 4A and 4B. Furthermore, when an modulating gate signal of arbitrary waveform and frequency is applied to the gate electrode 11 while the voltage higher the voltage $V_3$ is maintained, a laser beam whose intensity changes corresponding to the change of the signal can be obtained. Thus, the optical output of the semiconductor laser can be modulated.

Although, in the above embodiment, a semiconductor laser device composed of a GaAs/AlGaAs type laser diode and a GaAs type vertical MIS-FET was described, it is a matter of course that the present invention can be applied to a semiconductor laser device composed of an InP/InGaAsP system laser diode and an InP system vertical MIS-FET.

Although, in the above embodiment a combination of one laser diode and one vertical MIS-FET was described, a plurality of vertical MIS-FETs may be integrated in the horizontal direction in order to increase the drivable current and, in addition, a plurality of laser diodes may be integrated in the horizontal direction in order to increase the optical output. Namely, the present invention can be applied to a semiconductor laser device composed of a plurality of laser diodes and a plurality of vertical MIS-FETs.

Although in the vertical MIS-FET of the above embodiment the channel was formed adjacent to the inclined plane of the V shaped striped groove, the cross section of the striped groove may be U shape with a flat portion at the bottom thereof.

Although in the above embodiment a semiconductor laser which has a internal current squeezing CSP structure formed on a p-type substrate was described, the present invention may be implemented by using a semiconductor laser having an arbitrary structure and formed on the substrate of an arbitrary conductivity type.

Although the present invention has been described with reference to specific embodiments, it should be understood that these embodiments are examplary preferred embodiments and that modifications may be made without departing from the scope of the invention as defined in the appended claims.

What is claimed is:

1. In a semiconductor laser device:
   a semiconductor laser portion; said semiconductor laser portion including
   a semiconductor substrate of a first conductivity type, a first ohmic electrode connected to a surface of said substrate and
   at least one semiconductor laser having a double hetero structure formed on the top surface of said semiconductor substrate of the first conductiveity type; and
   at least one vertical field effect transistor portion formed on said semiconductor laser portion for modulating the optical output of said semiconductor laser portion; said vertical field effect transistor portion including
   a first semiconductor layer of a second conductivity type which is opposite to said first conductivity type, formed on the top surface of said semiconductor laser portion;
   a second semiconductor layer of the first conductivity type formed on the top surface of said first semiconductor layer; and
   a third semiconductor layer of the second conductivity type formed on the top surface of said second semiconductor layer, wherein a striped groove deep enough to reach at least the first semiconductor layer from the top surface of said third semiconductor layer is formed in said first, second and third semiconductor layers; a second ohmic electrode connected to a surface of said third semiconductor layer; said field effect transistor portion further comprising
   an insulating film formed on the top surface of said striped groove, and
   a gate electrode formed on the top surface of said insulating film.

2. A semiconductor laser device according to claim 1, wherein said semiconductor laser portion (17) comprises a Channeled Substrate Planar Stripe structure of an internal current squeezing type.

3. A semiconductor laser device according to claim 2, wherein said semiconductor laser comprises
   a current block layer (2) of the second conductivity type formed on the top surface of said semiconductor substrate of the first conductivity type;
   a clad layer (3) of the first conductivity type formed on the top surface of said current block layer;
   an activated layer (4) of the first or second conductivity type formed on the top surface of said clad layer (3);
   and a clad layer (5) of the second conductivity type formed on the top surface of said activated layer; wherein a striped structure (30) is formed in said semiconductor substrate of the first conductivity type and current block layer of the second conductivity type for squeezing the current.

4. A semiconductor laser device according to claim 3, wherein said striped structure (30) is positioned almost directly below said striped groove (31).

5. A semiconductor laser device according to claim 1, wherein said semiconductor laser portion (17) is formed of GaAs/AlGaAs system material, and said vertical field effect transistor portion (18) is formed of GaAs system material.

6. A semiconductor laser device according to claim 1, wherein said semiconductor laser portion (17) is formed of InP/InGaAsP system material, and said vertical field effect transistor portion (18) is formed of InP system material.

7. A semiconductor laser device according to claim 1, wherein said semiconductor laser portion (17) comprises a plurality of said semiconductor lasers integrated in the horizontal direction.

8. A semiconductor laser device according to claim 1, wherein a plurality of said vertical field effect transistors are integrated in the horizontal direction above said semiconductor laser portion (17).

9. A semiconductor laser device according to claim 1, wherein said striped groove (31) has a V shaped cross section.

10. A semiconductor laser device according to claim 1, wherein said striped groove (31) has a U shaped cross section with a flat portion at the bottom thereof.

11. A semiconductor laser device as recited in claim 1, wherein said double hetero structure of said at least one laser includes two cleaved surfaces which act as mirrors for a resonant cavity.

12. In a semiconductor laser device:
a semiconductor laser portion; said semiconductor laser portion including
a semiconductor substrate of a first conductivity type having a first ohmic electrode on its lower surface and
at least one semiconductor laser having a double hetero structure formed on the top surface of said semiconductor substrate of the first conductivity type; and
at least one vertical field effect transistor portion formed on said semiconductor laser portion for modulating the optical output of said semiconductor laser portion; said vertical field effect transistor portion including
a first semiconductor layer of a second conductivity type which is opposite to said first conductivity type, formed on the top surface of said semiconductor laser portion;
a second semicomductor layer of the first conductivity type formed on the top surface of said first semiconductor layer; and
a third semiconductor layer of the second conductivity type having a second ohmic electrode on its top surface, formed on the top surface of said second semiconductor layer, wherein a striped groove deep enough to reach at least the first semiconductor layer from the top surface of said third semiconductor layer is formed in said first, second and third semiconductor layers; said field effect transistor portion further comprising
an insulating film formed on the top surface of said stripped groove, and
a gate electrode formed on the top surface of said insulating film.

13. In a semiconductor laser as recited in claim 1, said first and second ohmic electrodes connected to an external power source.

* * * * *